United States Patent
Yu

(10) Patent No.: US 7,045,929 B2
(45) Date of Patent: May 16, 2006

(54) WEAR-PREMONITORY CARBON BRUSH HOLDER

(75) Inventor: Meng-Chiu Yu, No. 124, Tien Hsiang Street, North Area, Taichung (TW)

(73) Assignees: Su-Chen Liao, Taichung (TW); Meng-Chiu Yu, Taichung (TW)

( * ) Notice: Subject to any disclaimer, the term of this patent is extended or adjusted under 35 U.S.C. 154(b) by 0 days.

(21) Appl. No.: 10/755,396

(22) Filed: Jan. 13, 2004

(65) Prior Publication Data

US 2005/0110362 A1    May 26, 2005

(30) Foreign Application Priority Data

Nov. 25, 2003    (TW) .............................. 92220837 U

(51) Int. Cl.
*H01R 39/38*    (2006.01)

(52) U.S. Cl. ..................... 310/242; 245/247; 245/249

(58) Field of Classification Search ......... 310/237–249
See application file for complete search history.

(56) References Cited

U.S. PATENT DOCUMENTS

| 3,523,288 | A | * | 8/1970 | Thompson .................. 340/648 |
| 4,024,525 | A | * | 5/1977 | Baumgartner et al. ...... 340/648 |
| 4,723,084 | A | * | 2/1988 | Reynolds .................... 310/247 |
| 5,753,995 | A | * | 5/1998 | Ogino ........................ 310/242 |

* cited by examiner

*Primary Examiner*—Dang Le
(74) *Attorney, Agent, or Firm*—Bacon & Thomas, PLLC

(57) ABSTRACT

A wear-premonitory carbon brush holder includes a holder body and a premonitory circuit. A carbon brush that is received in the holder body is reciprocately moveable in the holder body along a predetermined path. The premonitory circuit has a sensing unit mounted on the holder body for activating the premonitory circuit to generate a predetermined action or a warning signal when the carbon brush moves in the holder body to a predetermined position.

6 Claims, 7 Drawing Sheets

WEAR-PREMONITORY CARBON BRUSH HOLDER

BACKGROUND OF THE INVENTION

1. Field of the Invention

The present invention relates generally to carbon brushes for use in motors, and more particularly to a wear-premonitory carbon brush holder.

2. Description of the Related Art

As shown in FIG. 1, a conventional carbon brush holder 1 includes a holder body 11 for accommodating a spring A and a carbon brush B. The spring A has an end contacting against an internal end of the holder body 11 and the other end contacting against an end of the carbon brush B; meanwhile, the carbon brush B is pushed by the spring A to contact against the rotor C of the motor and then transfers the electric current to the rotor C to drive the rotor C to rotate.

Because the friction generated between the carbon brush B and the rotor C wears the carbon brush B, the carbon brush B needs the resilience generated by the spring A to keep contacting against the rotor C. However, the resilience of the spring A will be gradually reduced when the spring A is self-extended along with the wear of the carbon brush B. When the carbon brush B is worn to a certain degree, the spring A fails to provide sufficient resilience to enable the carbon brush B to keep contacting against the rotor C, such that a gap will be formed between the carbon brush B and the rotor C to incur imperfect contact therebetween to further generate arc sparks. Thus, when the motor mounted with the carbon brush holder 1 is operated, the operator has to frequently check the wear degree of the carbon brush B and replace the carbon brush B when the carbon brush B is worn to a certain degree.

As shown in FIG. 2, another conventional carbon brush holder 2 is different from the aforementioned carbon brush holder 1 by that the spring D is a constant-force spring that generates balanced constant resilience to avoid the generation of the aforementioned arc sparks; however, the operator still has to frequently check the wear degree of the carbon brush 2.

SUMMARY OF THE INVENTION

The primary objective of the present invention is to provide a carbon brush holder that premonishes the operator to replace the carbon brush when the carbon brush is worn to a certain degree, and thereby it is unnecessary to frequently check whether the carbon brush is worn out and needs to be replaced.

The foregoing objective of the present invention is attained by the wear-premonitory carbon brush holder that is composed of a holder body and a premonitory circuit. A carbon brush is received in the holder body and slidably reciprocates along a predetermined path. The premonitory circuit has a sensing unit mounted on the holder body for activating the premonitory circuit to generate a predetermined action or a warning signal when the carbon brush moves to a predetermined position.

DETAILED DESCRIPTION OF THE INVENTION

Figure 1:
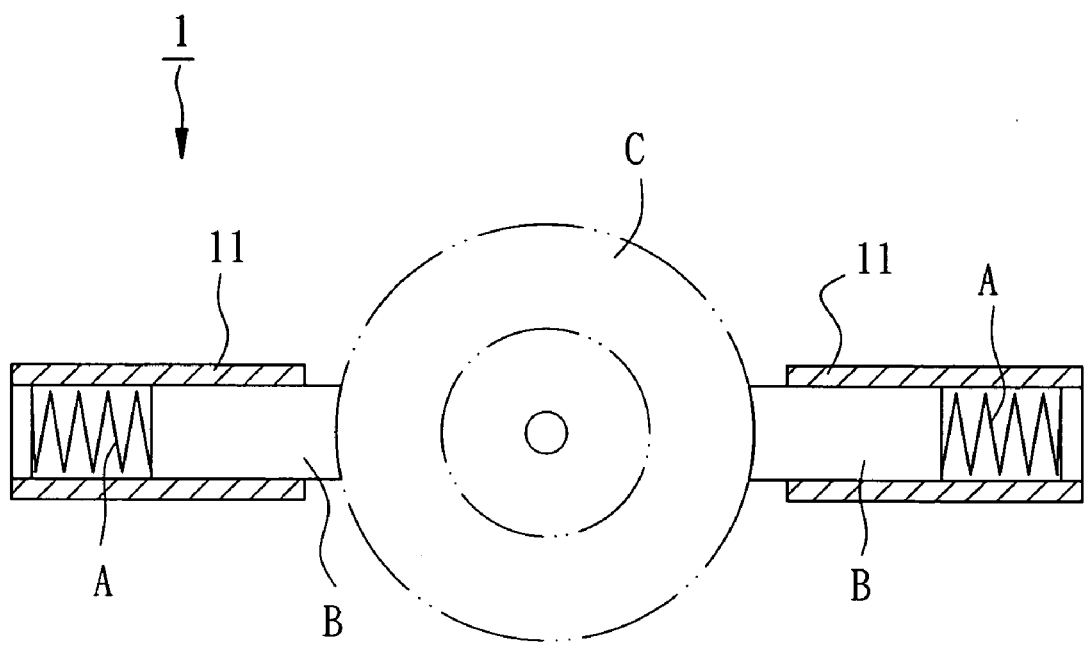
FIG. 1 is a schematic view of a conventional carbon brush working with a rotor of a motor.
Figure 2:
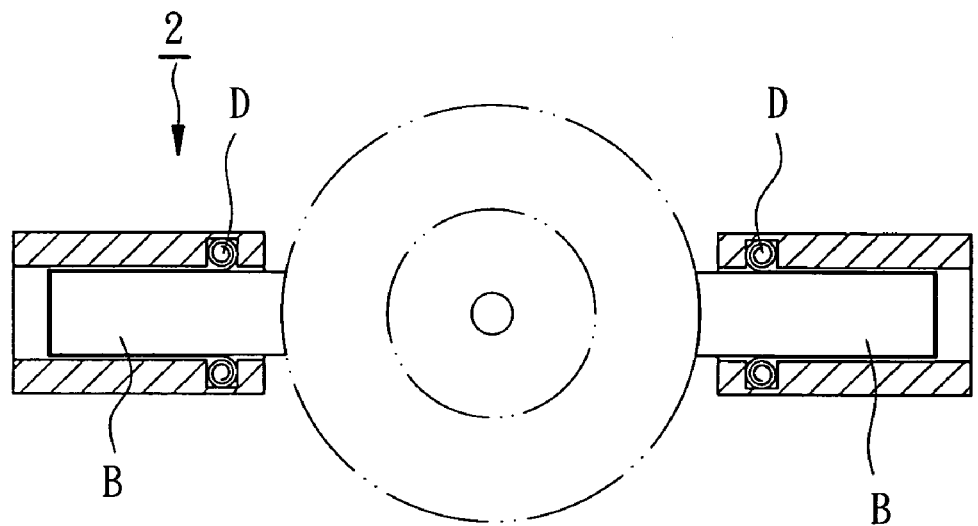
FIG. 2 is a schematic view of another conventional carbon brush working with a rotor of a motor.
Figure 3:
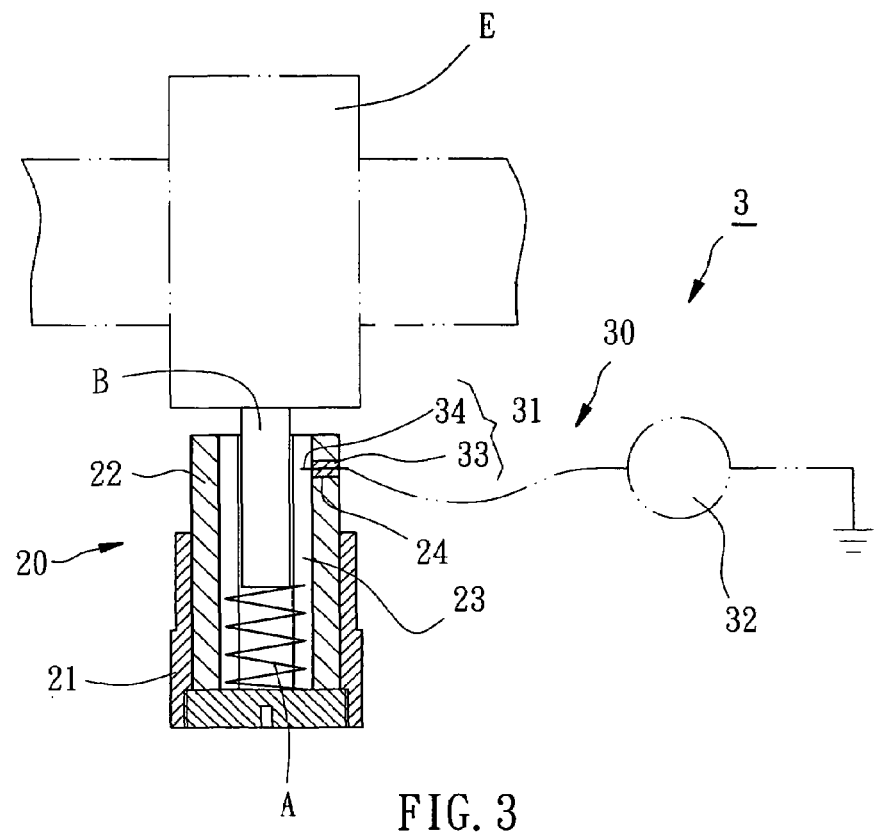
FIG. 3 is a sectional view of a first preferred embodiment of the present invention, showing that a tongue is away from a spring.

Referring to FIG. 3, a carbon brush holder 3 constructed according to a first preferred embodiment of the present invention is composed of a holder body 20 and a premonitory circuit 30.

The holder body 20 includes a base 21 and a copper barrel 22 in which an elongated receiving slot 23 that has an opening is provided. A spring A and a carbon brush B are accommodated in the receiving slot 23 through the opening. The holder body 20 has a through hole 24 running through the inner and outer walls of the copper barrel 22.

The premonitory circuit 30 includes a sensing unit 31 and an alarm indicator 32, which is embodied as a warning lamp in this preferred embodiment. The sensing unit 31 is formed of an insulated plug 33 and an electrically conductive member which is embodied as a copper springy tongue 34 in this embodiment. The insulated plug 33 is securely disposed in the through hole 24 of the copper barrel 22. The springy tongue 34 is inserted into a midsection of the insulated plug 33 and has a free end extending into the receiving slot 23 and the other end electrically connected with the alarm indicator 32 of the premonitory circuit 30 by wire. When the carbon brush B is worn to a certain degree, the spring A that is self-extended due to the wear of the carbon brush B contacts the free end of the springy tongue 34 as shown in FIG. 4.

Figure 4:
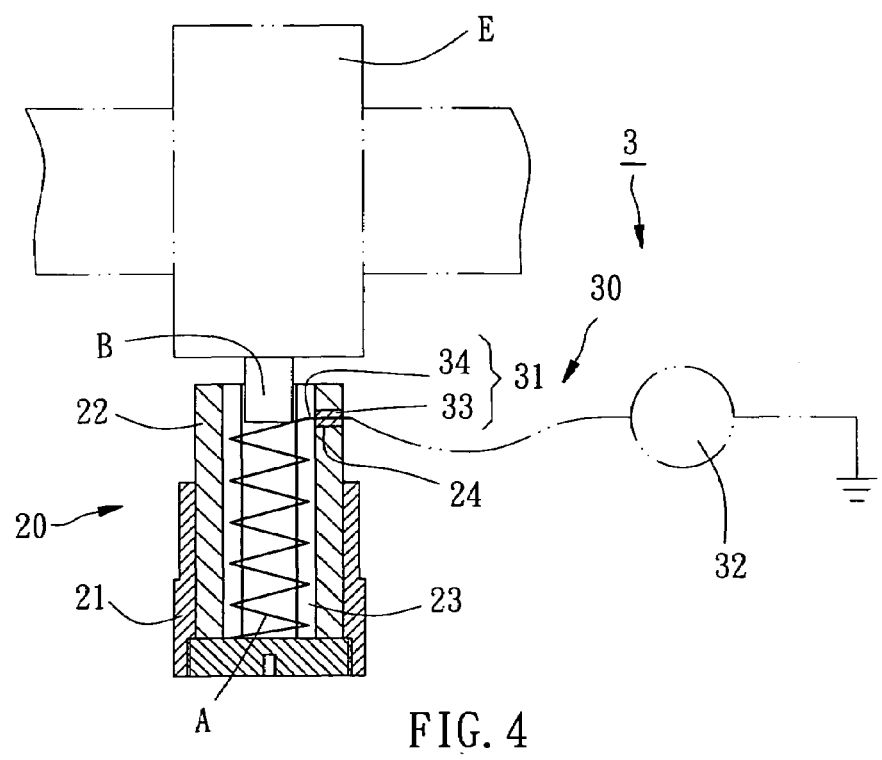
FIG. 4 is another sectional view of the first preferred embodiment of the present invention, showing that the tongue contacts the spring.

Referring to FIG. 4, when an end of the carbon brush B keeps contacting against a surface of a rotor E of a motor to be worn, the spring A resiliently extends forwards to keep the worn end of the carbon brush B contacting against the surface of the rotor E. When the spring A resiliently extends further for a length to contact the springy tongue 34, the electric current flows through the connection between the spring A and the springy tongue 34 to electrically conduct the premonitory circuit 30 to further activate the alarm indicator 32 to function.

When the carbon brush B is worn for a predetermined length, the premonitory circuit 30 generates a predetermined action or transmits a warning signal to prompt the operator to replace the worn carbon brush B, such that the operator will not have to frequently check the wear degree of the carbon brush B and decide whether the carbon brush B needs to be replaced. Hence, the present invention saves lots of time of checking for the operator to avoid the carbon brush B from being worn-out that causes sudden stop of the motor to further incur abnormal operation.

The sensing unit of the premonitory circuit and the warning signal can be any alternatives that alert the operator to replace the carbon brush when the carbon brush is worn to a certain degree.

Figure 5:
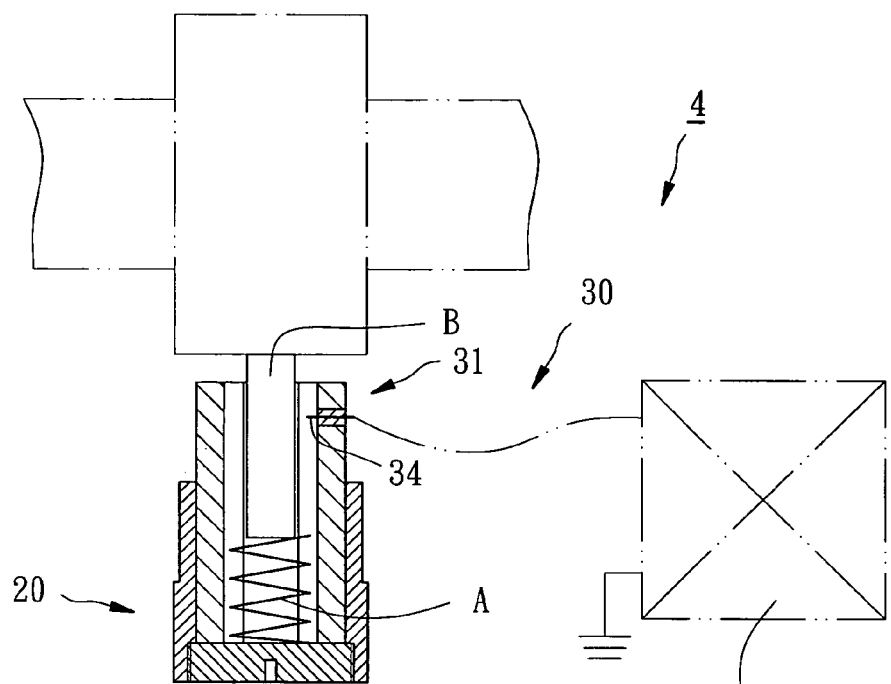
FIG. 5 is a sectional view of a second preferred embodiment of the present invention.

Referring to FIG. 5, the carbon holder 4 constructed according to a second preferred embodiment of the present invention is shown different from the aforementioned first preferred embodiment by that the premonitory circuit 30 further includes a normally open switch loop 35 and a warning unit (not shown), which can be embodied as a buzzer, an alarm indicator, and so on, in addition to the sensing unit 31. When the carbon brush B is worn to a certain degree, the spring A extends to contact the springy tongue 34 to be electrically connected with the switch loop 35 to further activate the warning unit to function.

Figure 6:
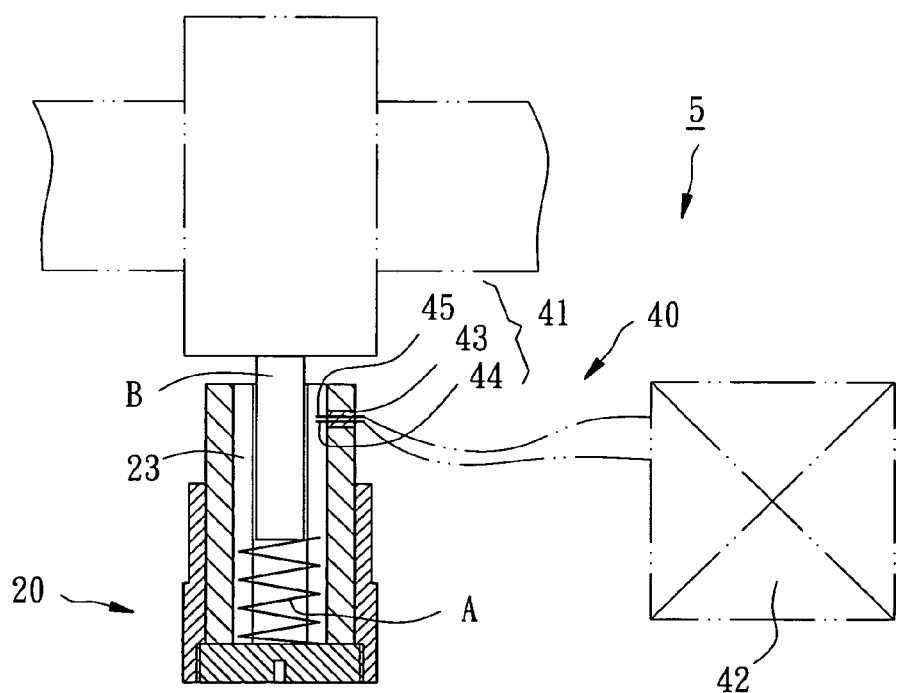
FIG. 6 is a sectional view of a third preferred embodiment of the present invention.

Referring to FIG. 6, the carbon holder 5 constructed according to a third preferred embodiment of the present invention is different from the second preferred embodiment by that the premonitory circuit 40 further includes a sensing unit 41 having an insulated plug 43, a first tongue 44 and a second tongue 45 in addition to the normally open switch loop 42 and the warning unit (not shown). The first and second tongues 44 and 45 are inserted inside the insulated plug 43 and parallel spaced apart from each other for a predetermined distance. The first and second tongues 44 and 45 each have a free end extending into the receiving slot 23 of the holder body 20 to be at a position which the spring A can contact while the spring A extends, and other end connected with the premonitory circuit 40. Thus, the two tongues 44 and 45 contact each other to electrically conduct the switch loop 42 to activate the warning unit to function.

When the carbon brush B is worn to enable the spring A to extend to a predetermined position, the spring A contacts and pushes the first tongue 44 to bend, then the first tongue 44 contacts the second tongue 45 to enable the switch loop 42 of the premonitory circuit 40 to be electrically conducted, and further the warning unit transmits a warning signal or action.

Figure 7:
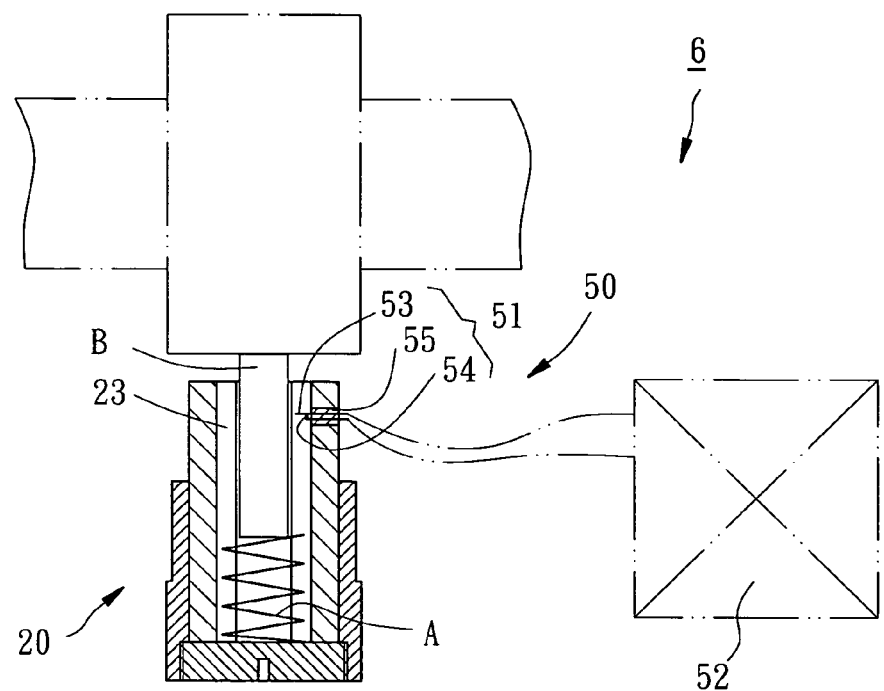
FIG. 7 is a sectional view of a fourth preferred embodiment of the present invention.

Referring to FIG. 7, the carbon holder 6 constructed according to a fourth preferred embodiment of the present invention is characterized in that the premonitory circuit 50 includes a sensing unit 51 having a first tongue 53 and a second tongue 54 and an insulated plug 55, a normally close switch loop 52 and a warning unit (not shown). The free ends of the first and second tongues 53 and 54 are slightly set to contact each other without bearing a force. In addition, the first tongue 53 is positioned close to the opening of the holder body 20 more than the second tongue 54 does, and the length that the first tongue 53 extends into the receiving slot 23 is longer than the second tongue 54. When the carbon brush B is worn to enable the spring A to extend for a predetermined length, the first tongue 53 is contacted by the spring A to be pushed to further disengage from the second tongue 54, such that the switch loop 52 is off to activate the warning unit to transmit a warning signal.

Figure 8:
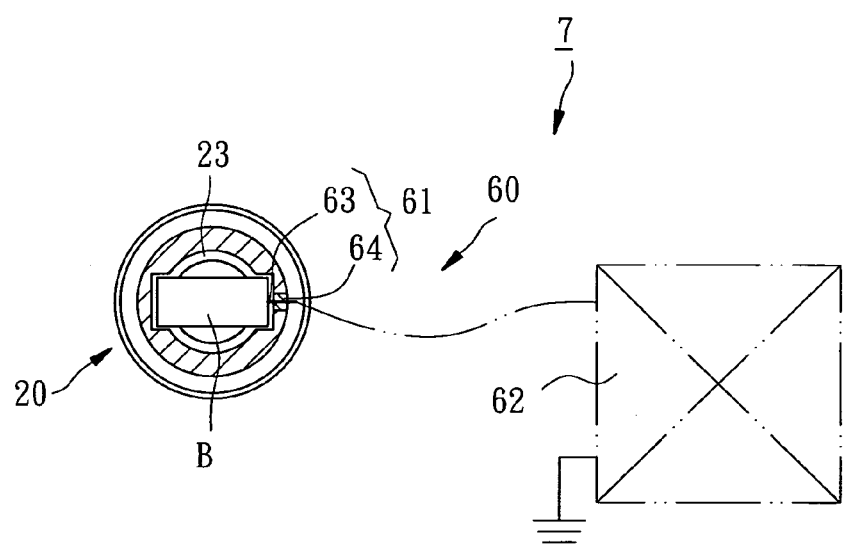
FIG. 8 is a top view of a fifth preferred embodiment of the present invention.
Figure 9:
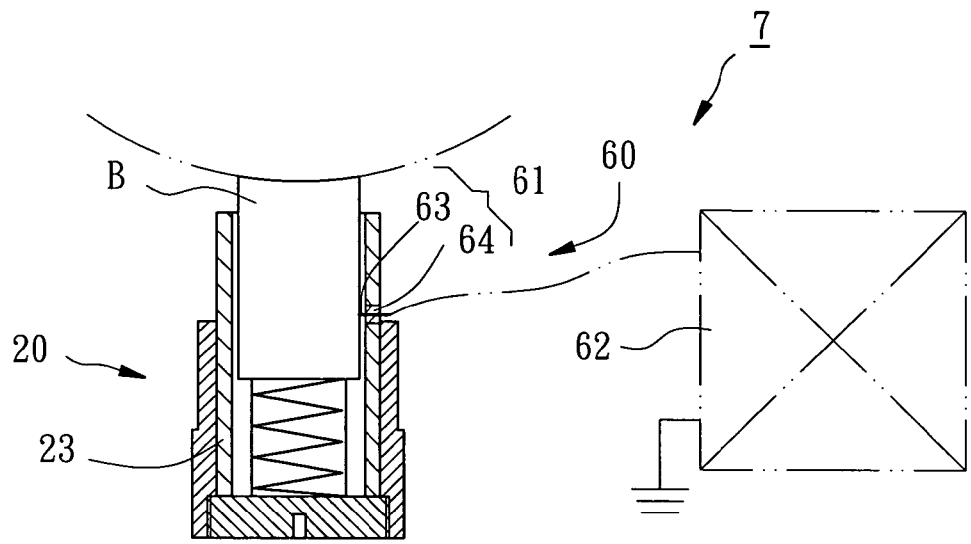
FIG. 9 is a sectional view of the fifth preferred embodiment of the present invention, showing that a carbon brush contacts the tongue.
Figure 10:
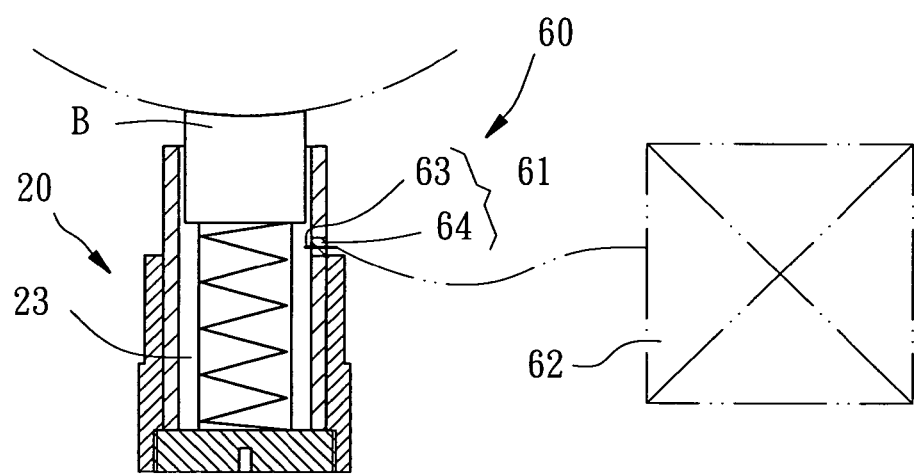
FIG. 10 similar to FIG. 9 shows that the tongue is away from the carbon brush.

Referring to FIGS. 8–10, the carbon brush holder 7 constructed according to a fifth preferred embodiment of the present invention is characterized in that the premonitory circuit 60 includes a sensing unit 61 having a tongue 63 and an insulated plug 64, a normally close switch loop 62 and a warning unit (not shown). The tongue 63 is inserted inside the insulated plug 64 that is mounted on the holder body 20 and has a free end extending to the receiving slot 23 to keep contacting the carbon brush B. When the tongue 63 disengages from the carbon brush B, the normally close switch loop 62 is off to activate the warning unit.

Figure 11:
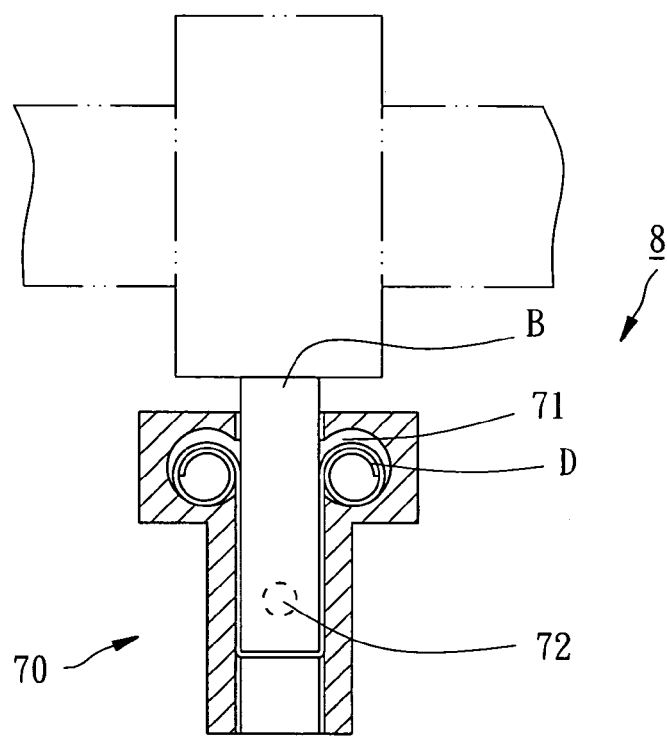
FIG. 11 is a front sectional view of a sixth preferred embodiment of the present invention.
Figure 12:
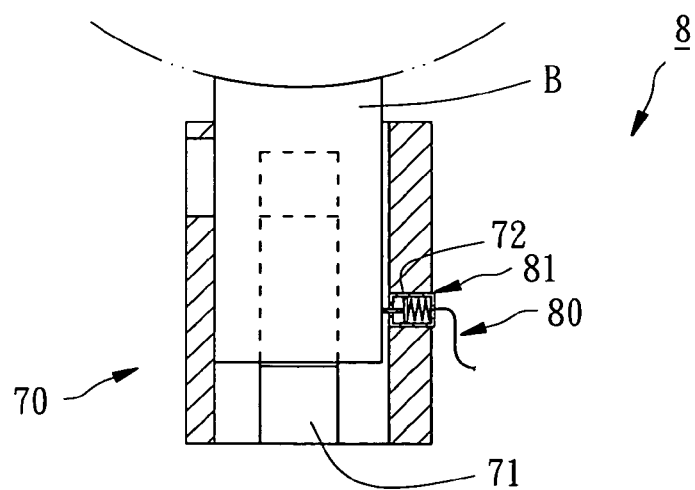
FIG. 12 is a right sectional view of the sixth preferred embodiment of the present invention, showing that an actuating bar is oppressed.
Figure 13:
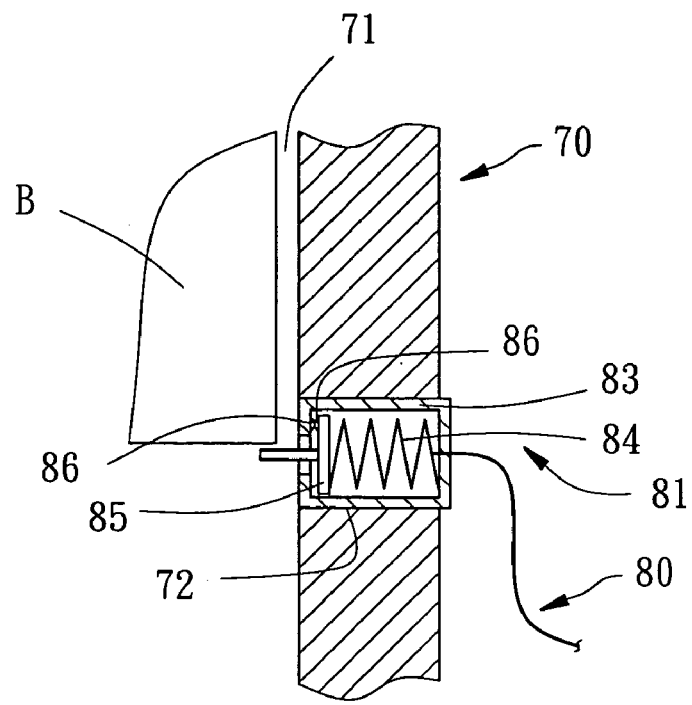
FIG. 13 is another right sectional view of the sixth preferred embodiment of the present invention, showing that the actuating bar is not exerted by a force.

Referring to FIGS. 11–13, the carbon brush holder 8 constructed according to a sixth preferred embodiment of the present invention is composed of a holder body 70 and a premonitory circuit 80.

The holder body 70 includes a receiving slot 71 and a through hole 72. The receiving slot 71 has an opening at a top end thereof for accommodating a constant-force spring D and a carbon brush B. The through hole 72 is positioned on the holder body 70 away from the opening of the receiving slot 71 and runs through the holder body for communication between inside and outside of the holder body 70.

The premonitory circuit 80 includes a resilient switch 81, a normally open switch loop (not shown), and a warning unit (not shown). The resilient switch 81 is composed of a shell 83, a spring 84, and an actuating bar 85. Each of the shell 83 and the actuating bar 85 is provided with a conductive piece 86. When the actuating bar 85 is not exerted by any of forces, the spring 84 pushes the actuating bar 85 to enable the two conductive pieces 86 to contact each other. When the actuating bar 85 is exerted by a force, the actuating bar 85 is driven to moves towards inside of the shell 83 to compress the spring 84 to isolate the two conductive pieces 86, as shown in FIG. 12. The resilient switch 81 is mounted inside the through hole 72 of the holder body 70. Normally, the actuating bar 85 is pushed by the carbon brush B at an end thereof to move towards inside the shell 93 to compress the spring 84, as sown in FIG. 12. The switch loop is designed being electrically conducted by the contact of the two conductive pieces 87 to further activate the warning unit.

When the carbon brush B is worn to be pushed outwards by the constant-force spring D to disengage from the actuating bar 85, the spring 84 pushes the actuating bar 85 to move towards the carbon brush B to enable the conductive piece 86 of the actuating bar 85 to contact the conductive piece 86 of the shell 83, as shown in FIG. 13, and the switch loop is electrically conducted to activate the warning unit to transmit a warning signal.

Figure 14:
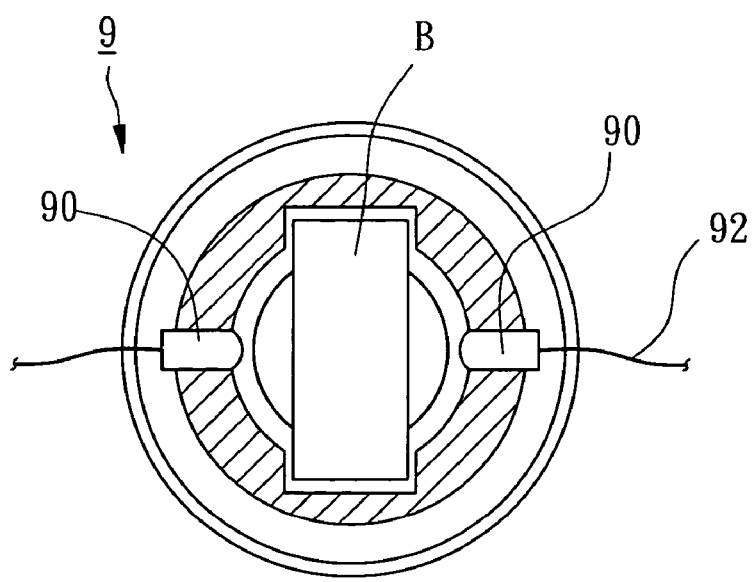
FIG. 14 is a sectional view of a seventh preferred embodiment of the present invention.

Referring to FIG. 14, the carbon brush holder 9 constructed according to a seventh preferred embodiment of the present invention is different from the aforementioned preferred embodiments by that the sensing unit 90 is composed of an infrared transmitter and an infrared receiver. The carbon brush B interrupts the communication between the infrared transmitter and the infrared receiver in a normal condition. When the carbon brush B is worn for a predetermined length, the carbon brush B moves away to remove the interruption of the communication and then the receiver can receive the signal transmitted from the transmitter, thereby activating the premonitory circuit 92 to transmit the warning signal.

Furthermore, the sensing unit of the present invention can alternatively be other sensors, such as a sensor that detects the difference of colors or materials.

What is claimed is:

1. In a wear-premonitory carbon brush holder assembly including a carbon brush movably disposed within a brush holder and urged by a spring into engagement against a rotor of a motor, a sensing unit mounted on the brush holder and connected to a premonitory circuit for producing a warning signal upon the sensing unit being contacted by the spring when the carbon brush is worn to a predetermined level, the improvement comprising:

the sensing unit including a hole formed through a wall of the brush holder, an insulated plug disposed within the hole, and a tongue extending through a midsection of the insulated plug, the tongue having a first end extending into the brush holder for contact by the spring and a second end connected to the premonitory circuit.

2. The carbon brush holder as defined in claim 1, wherein said holder body comprises a receiving slot for receiving therein said carbon brush and a spring connected between said holder body and said carbon brush; said sensing unit comprises a tongue mounted on said holder body and having an end extending into said receiving slot to keep contacting said carbon brush; when said carbon brush disengages from said tongue, said premonitory circuit is activated to generate the action or the warning signal.

3. The carbon brush holder as defined in claim 2, wherein said holder body further comprises a copper barrel in which said receiving slot is provided, said copper barrel having a through hole running therethrough between said receiving slot and an outside thereof; said sensing unit further comprises an insulated plug inserted into said through hole of said copper barrel; wherein said tongue is mounted through said insulated plug.

4. The carbon brush as defined in claim 1, wherein said premonitory circuit comprises a normally close switch loop and a warning unit, said switch loop being off to generate the warning signal while said tongue disengages from said carbon brush.

5. The carbon brush holder assembly of claim 1, wherein the improvement further comprises the tongue being formed of springy copper.

6. The brush holder assembly of claim 1, wherein the improvement further comprises the brush holder including a copper barrel and the hole is formed through a wall of the copper barrel.

* * * * *